United States Patent [19]

Livesay

[11] 3,983,401
[45] Sept. 28, 1976

[54] METHOD AND APPARATUS FOR TARGET SUPPORT IN ELECTRON PROJECTION SYSTEMS

[75] Inventor: William R. Livesay, San Diego, Calif.

[73] Assignee: Electron Beam Microfabrication Corporation, San Diego, Calif.

[22] Filed: Mar. 13, 1975

[21] Appl. No.: 558,073

[52] U.S. Cl............................. 250/492 A; 250/398
[51] Int. Cl.² ....................................... H01J 37/30
[58] Field of Search................ 250/492, 492 A, 396, 250/398

[56] References Cited
UNITED STATES PATENTS

| | | | |
|---|---|---|---|
| 3,551,734 | 12/1970 | O'Keeffe et al.................. | 250/492 A |
| 3,619,608 | 11/1971 | Westerberg..................... | 250/492 A |
| 3,707,765 | 1/1973 | Coleman......................... | 250/492 A |
| 3,745,358 | 7/1973 | Firtz et al. ...................... | 250/492 A |
| 3,809,582 | 5/1974 | Tarneja et al................... | 250/492 A |

OTHER PUBLICATIONS
"Electrostatic Wafer Chuck for Electron Beam Microfabrication" George Wardly, Rev. Sci. Instrum., vol. 44, No. 10, Oct. 1973 pp. 1506–1509.

Primary Examiner—Alfred E. Smith
Assistant Examiner—Bruce C. Anderson
Attorney, Agent, or Firm—Fulwider, Patton, Rieber, Lee & Utecht

[57] ABSTRACT

Apparatus and a corresponding method for supporting a wafer of target material for exposure to a beam or pattern of electrons with little or no distortion of the electric field used to accelerate the electrons from a cathode to the target. In one embodiment, the target wafer is supported on a flat pedestal some distance above a surrounding anode structure, and is insulated from the pedestal by a thin dielectric sheet. A bias voltage applied between the wafer and the pedestal and anode structure is selected to minimize distortion of the electric field, and also serves to secure and flatten the wafer against the pedestal by electrostatic attraction. Alternatively, the wafer may be held in position by a retaining lip projecting over the edges of the wafer, the lip having a conductive surface layer insulated by a dielectric layer from the remainder of the lip and from the wafer. Distortion of the electron-accelerating field is minimized by applying an appropriate bias voltage between the wafer and the conductive layer on the lip.

14 Claims, 5 Drawing Figures

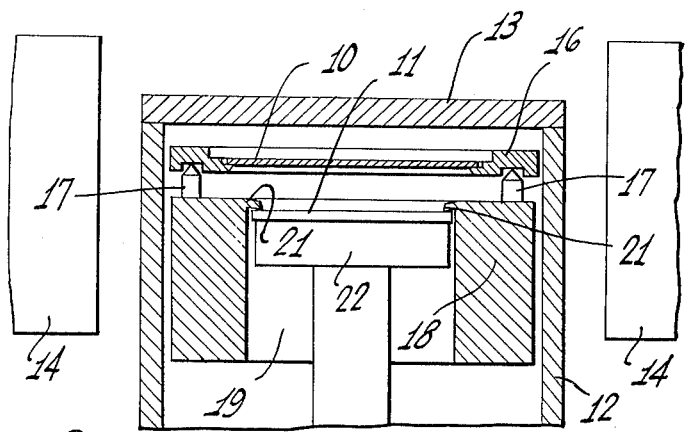
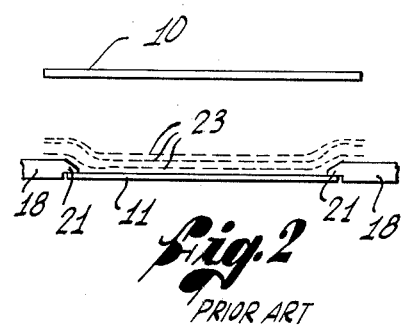
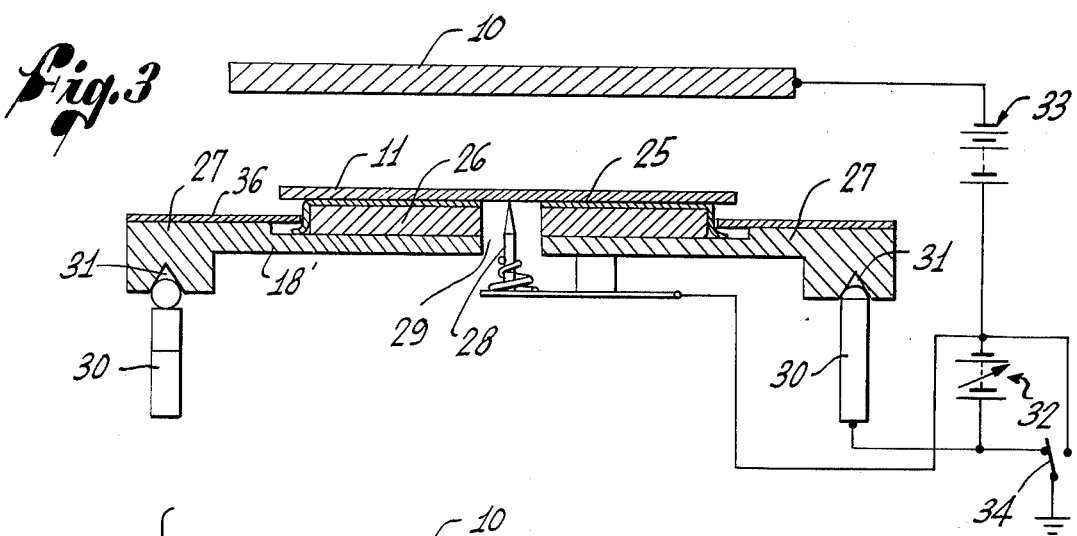
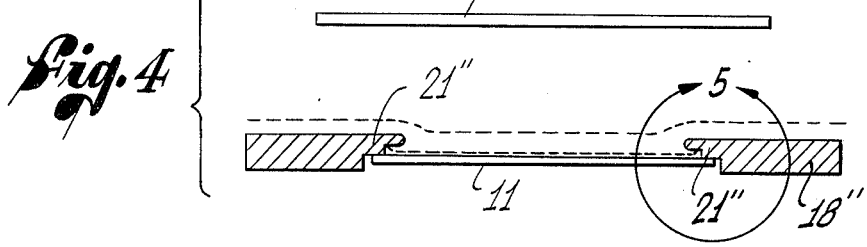
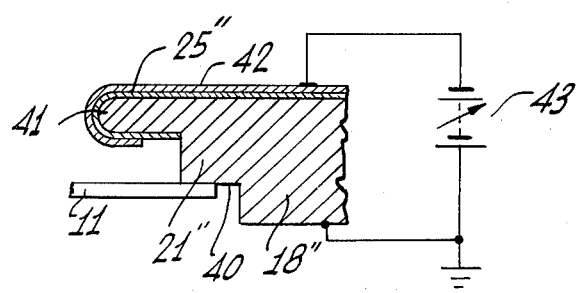

METHOD AND APPARATUS FOR TARGET SUPPORT IN ELECTRON PROJECTION SYSTEMS

BACKGROUND OF THE INVENTION

This invention relates generally to improvements in electron projection systems, and, more particularly, to new and improved apparatus for supporting and securing target wafers for exposure to an electron pattern or beam in such systems.

Electron beam pattern generation systems, in which a pattern of electron radiation on a sensitized surface is generated by movement of a single focused beam, and electron image projection systems, in which the pattern of electron radiation is emitted from a cathode mask, are both well known in the art. In either type of system, an electron-sensitized surface of a wafer of target material is exposed to the desired electron pattern, and, in the manufacture of micro-electronic circuitry, is subsequently developed, etched, and further processed to produce a completed integrated circuit. Masks used in integrated circuit fabrication may themselves be generated using an electron beam pattern generator, or may be fabricated from a master mask by utilizing an electron image projection system. Although both image projection systems and beam pattern generators of the general type described are known in the prior art, they have so far enjoyed only limited use in the fabrication of micro-electronic circuitry because of certain limitations, one of which is overcome by the present invention. In order to fully appreciate these limitations, it is desirable to have at least a basic understanding of the principles of operation of electron image projection systems and electron beam pattern generators. Accordingly, the following background material summarizes the prior art systems and their limitations.

An electron pattern generator includes an electron gun, together with a conventional electron beam deflection system. The deflection system may be controlled by a digital computer, through suitable digital-to-analog converters, so as to sweep the electron beam through a desired pattern and to expose the electron-sensitized surface on a target wafer which is appropriately disposed with respect to the beam. In electron image projection systems, a photocathode mask is illuminated with a suitable light source, typically ultraviolet light, so as to cause the emission of electrons in a pattern for acceleration toward and exposure of the electron-sensitized surface of the target wafer. In either system, a large accelerating electric field is imposed between the electron source and the target, to minmize any undesired excursion of the electrons in a direction perpendicular to the beam or projection. However, in either system, electrons are emitted with some component of velocity perpendicular to their desired trajectory, and consequently, some means of focusing the electron beam or image is generally provided.

Unfortunately, the electrical characteristics of a typical target holder for electron projection systems, and particularly for electron image projection systems, may cause certain distortion of the image formed on the target. Since image projection systems are more susceptible to this type of distortion than electron beam pattern generators, the problems and characteristics of an electron image projection system are more particularly described herein. It should be recognized, however, that the principles of focusing and the problem of target hold-down to be described are also directly applicable to electron beam pattern generators.

In a typical electron image projection system using a photocathode mask, an ultraviolet light source is mounted within a vacuum chamber, typically near the top thereof, and a mask support is provided to support the photocathode mask for direct and substantially uniform illumination by the light source. The target wafer on which the image is to be projected is mounted below the mask and is electrically biased at a high positive potential relative to the photocathode surface, so that electrons emitted from the photocathode will be rapidly accelerated to the target surface and will impinge thereon in the same pattern as they were emitted from the photocathode. However, since the electrons are emitted with some finite energy, and generally may be emitted in practically any direction, any emission velocity component parallel to the photocathode surface will result in lack of focus in the image produced at the target. To focus the image, a magnetic field of controlled uniform intensity may be created having a direction parallel to the desired path of the electrons. Thus, the undesired component, that is, the horizontal component of velocity of the electrons, is a component perpendicular to the magnetic focusing field.

As is well known, an electron moving perpendicularly to a magnetic field will follow a circular orbit. The radius of the orbit is given by the equation: $R = MV/Bq$, where $R$ is the radius of the circular orbit, $M$ is the mass of the electron, $V$ is the velocity of the electron perpendicular to the uniform field, $B$ is the flux density of the magnetic field, and $q$ is the charge of the electron. The time required for an electron to make one circular orbit is equal to the circumference of that orbit divided by the electron velocity, or $T = 2\pi R/V$. Substituting for the radius $R$ as given in the previous equation, it may be seen that the time for a circular orbit is $2\pi M/Bq$. Thus, the time required for an electron to make a circular orbit is independent of the component of velocity perpendicular to the magnetic field. Consequently, if the magnetic flux density is properly selected, the electrons may be caused to follow a helical trajectory in which an integral number of orbits is completed before the electrons impinge on the target. Thus, the image is focused on the target irrespective of the horizontal component of velocity of particular electrons, although the image at various planes between the photocathode and the target will not necessarily be in focus.

It will be apparent that focusing as outlined above will be achieved without distortion of the image impinging on the target only if the equipotential surfaces between the photocathode and the target are truly parallel and flat surfaces, and if the axial magnetic field is perfectly uniform. In systems of the prior art, the mounting of both the photocathode and the target have been such that the equipotential surfaces at and near both the photocathode and the target are not perfectly flat surfaces. This has the undesired effect of distorting the image on the target, since, there will be components of the electric field in directions parallel to the photocathode and the target. Electrons exposed to these components will be accelerated parallel to the cathode and target.

As has been explained, electrons emitted from the photocathode with an undesired component of velocity parallel to the photocathode may be focused electromagnetically in an ideal system having a perfectly uniform electric field. However, if such an undesired velocity component is obtained as a result of field distortion, focus cannot always be effected in the same manner. That is, some electrons will not complete one full orbit or an integral number of orbits before impinging upon the target. This effect, unless extreme, does not exhibit itself primarily as a lack of focus, because the electrons emitted from a particular area on the photocathode will each experience the same electric field profile, and therefore the same fractional orbit, before impinging on the target.

Rather than being out of focus at the target, the electrons emitted at a position radially displaced from a central axis of the system will impinge on the target at a laterally shifted position which is not directly under the area from which they were emitted. Since the electric field distortion normally becomes particularly severe adjacent to the edges of the target and the photocathode, the resulting pattern distortion is at a maximum near the edges of the pattern. While there will also be some loss in focusing at the edges, the primary effect of the distortion in the electric field is a so-called spiral or anisotropic distortion in the image projected onto the target.

In integrated circuit manufacturing, elements having a width of only a few ten thousandths of an inch are defined by a pattern which may be created by an electron image projection system having an edge definition in the range of 10 micro-inches or less. Consequently, any significant distortion, and particularly distortion between individual masks within a mask set, can cause the resulting circuit to be inoperative.

In addition to problems relating to distortion of the electron-accelerating field, target wafer holders in systems available heretofore have been unsuccessful in holding thin wafers of target material perfectly flat. Typically, in the prior art, a wafer is secured by its edges under a circumferential lip or a plurality of edge clamps which hold the wafer in position. Since the target material usually takes the form of thin wafers which are often warped and bowed, holding the wafers down by their edges does not always completely flatten them, and often contributes additional non-planar distortion.

There exists, therefore, an urgent need for a wafer supporting and securing means which will hold a wafer perfectly flat, will minimize the distortion of the electron accelerating field, and will thereby allow the projection of more accurate images for such purposes as the fabrication of high-accuracy masks and for microelectronic circuitry fabrication from such masks. The present invention fulfills this need.

SUMMARY OF THE INVENTION

The present invention resides in an improved wafer holder and a method for its use which minimize distortion of the electron-accelerating field. Basically, the apparatus of the invention includes a wafer support, a dielectric layer disposed over a portion of the wafer support, and means for applying a bias voltage across the thickness of the dielectric layer to obtain the desired uniformity of the electron-accelerating field.

More specifically, one presently preferred embodiment of the invention includes a substantially flat supporting pedestal against which the wafer is to be secured, and the dielectric layer is a relatively thin sheet of insulating material disposed between the pedestal and the wafer, the bias voltage being applied between the pedestal and the wafer to electrostatically attract and flatten the wafer against the pedestal. In this particular embodiment, the bias voltage can be selected so as not to disturb the uniformity of the electron-accelerating potential gradient between a cathode element and an anode structure surrounding and integral with the pedestal. A retaining element may be utilized to hold the sheet stretched in position over the pedestal, and electrical contacting means are employed to apply the bias voltage between the wafer and the pedestal, one of which is normally grounded. If the pedestal is circular in shape, as viewed along the electron beam, the retaining element may take the form of an annular ring.

In an alternative embodiment of the invention, the wafer is held against a retaining lip, in somewhat similar fashion to wafer holders of the prior art. However, the lip is coated with a dielectric layer, over which a separate electrically conductive layer is affixed. The bias voltage is then applied between that portion of the retaining lip which is in contact with the wafer, and the conductive layer. The bias voltage can be adjusted to minimize distortion of the electron-accelerating field due to the presence of the lip, thus minimizing inaccuracies in the electron pattern projected onto the wafer.

Briefly, the method of the present invention includes the steps of supporting a target wafer on a target support, interposing in the electron-accelerating field an insulating layer positioned on the target support, and applying a bias voltage across the thickness of the insulating layer to maintain substantial uniformity of the electron-accelerating field. The method may also include the steps of varying the bias voltage to minimize distortion of the field, and electrostatically attracting and flattening the target wafer against the wafer support.

It will be apparent from the foregoing that the present invention represents a significant advance over previously available means for supporting and holding a target in a flat plane within an electron projection system, with minimal distortion of the electron-accelerating field. Other aspects and advantages of the invention will become apparent from the following more detailed description taken in conjunction with the accompanying drawings.

BRIEF DESCRIPTION OF THE DRAWINGS

FIG. 1 is a fragmentary, sectional view illustrating the principal portions of a conventional electron image projection system, including a wafer-holder of the prior art;

FIG. 2 is an enlarged sectional view of the prior art wafer-holder shown in FIG. 1;

FIG. 3 is a combined sectional view and electrical schematic of the wafer holding and securing apparatus of the present invention;

FIG. 4 is a sectional view of an alternative embodiment of the present invention; and FIG. 5 is an enlarged, fragmentary, sectional view of the area 5 in FIG. 4.

DETAILED DESCRIPTION

As shown in the drawings for purposes of illustration, the present invention is embodied in an improved wafer-holding device for use in an electron projection system, either an electron beam pattern generator, or an electron image projection system similar to the one shown in FIG. 1.

In the illustrative system a photocathode mask, indicated by reference numeral 10, is aligned above a wafer 11 of target material, inside a vacuum envelope 12 which is provided with a window 13 transparent to ultraviolet light, the window being located above the photocathode, so that the latter may be illuminated by an ultraviolet light source (not shown) external to the vacuum envelope. The photocathode mask 10 emits electrons in a desired predetermined pattern when exposed to the ultraviolet light, and the emitted electrons are accelerated toward the wafer 11 by a strong electric field, and are focused onto the wafer surface by means of an electromagnetic focusing coil 14.

The photocathode mask 10 is mounted in a mask holder 16, which is aligned by pins 17 with respect to a target wafer support 18. The wafer support 18 has an opening 19 with a circumferential lip 21 projecting into the opening from the upper surface of the wafer support. A piston-like loading platform 22 is movable vertically along the longitudinal axis of the opening 19, and clamps the wafer 11 against the lip 21 during exposure to the electron image. The platform 22 may also be used to lower the wafer 11 for removal and replacement after exposure to the image. Suitable ancillary equipment, such as vacuum interlock systems, mechanical manipulating devices, ultraviolet light, and vacuum pumps, are well known in the prior art, and have been omitted from the drawings for simplicity.

As best observed in FIG. 2, the lip 21 overlaps the edges of the wafer 11, and the lip structure rises a significant distance above the wafer surface. Consequently, when a voltage is applied between the photocathode mask 10 and the wafer 11, to accelerate electrons from the mask to the wafer, equipotential surfaces close to the wafer will, as shown by the dotted lines 23, be distorted from flat planar surfaces by the presence of the lip 21. As previously pointed out, this distortion has an undesirble effect on the projected image.

As a main feature of the invention, distortion of the electron-accelerating field is minimized by means of a dielectric sheet 25 covering a portion of the wafer support, and by the application of a bias voltage across the thickness of the dielectric sheet. As shown more specifically in FIG. 3 for one presently preferred embodiment of the invention, the wafer support 18' includes a flat pedestal 26 integral with and raised slightly above a surrounding portion 27 of the wafer support, which also serves as an anode. The illustrative structure, including the wafer support 18' and pedestal 26, may be circular in shape, as viewed from the mask 10, although the invention is not, of course, so limited.

Overlying the pedestal 26 is a thin sheet of electrically insulating material, such as MYLAR, which forms the dielectric sheet 25 and is disposed, in this embodiment, between the pedestal and the wafer 11. The sheet 25 should be as thin as possible, the principal limitation being its susceptibility to electrical break-down. Thicknesses of 0.005 to 0.001 inch have been found to be satisfactory, but the optimum thickness will depend, of course, on other parameters of the projection system, such as the voltage gradient of the electron-accelerating field. Electrical connection with the wafer 11 is made by means of a pointed, spring-loaded pin 28, which is urged upwardly through a hole 29 defined in the pedestal 26 and the dielectric sheet 25. The pointed pin 27 pierces any oxide or other insulating coating on the wafer 11 to establish good electrical contact therewith. One of a plurality of supporting pins 30 engaging openings 31 in the wafer support 18', is used to establish electrical contact with the wafer support and the pedestal 26.

A stable, variable voltage source, indicated diagrammatically at 32, is connected between the pin 28 and the contact pin 30, to apply a negative potential to the wafer 11 relative to the pedestal 26. As is usual for electron projection systems, the photocathode 10 is connected to the negative terminal of a source of relatively high voltage, indicated at 33. As will hereinafter become apparent, either the wafer 11 or the pedestal 26 and wafer support 18' may be grounded, as shown diagrammatically by a double-throw switch 34. Also included in this embodiment is an annular retaining ring 36 having a central opening sized to fit snugly over the pedestal 26 and the dielectric sheet 25, to secure the latter in place on the pedestal 26.

The pedestal 26 should be of electrically conductive and preferably non-magnetic material such as aluminum or beryllium copper. Alternatively, the pedestal 26 may be made from a block of quartz covered with a conductive coating of, for example, chromium, applied by a thermal evaporation or sputtering process. Quartz has the advantage that it may be polished perfectly flat. Furthermore, such a thin conductive layer on the pedestal 26 tends to be "self-healing" in the event of a localized electrical break-down of the dielectric sheet 25, since the conductive layer at the point of break-down burns away and reduces the possibility of further break-down at that point. The pedestal 26 holds the wafer 11 above the surrounding portion 27 of the wafer support 18' by a distance of approximately 0.03 inch. The potential gradient of the electron-accelerating field in the illustrative embodiment is approximately 25 volts per 0.001 inch. Thus, for the potential gradient between the photocathode mask 11 and the wafer support 18' to remain uniform, the bias voltage applied to the wafer 10 should be approximately 30 × 25, or 750 volts.

The bias voltage applied across the dielectric sheet 25 also serves to attract and hold the wafer 11 electrostatically in a flat plane against the pedestal 26. As is well known, the theoretical attractive pressure between two parallel charged surfaces is given by the formula:

$$f = \frac{V^2 \epsilon_o \epsilon_r}{2s^2}$$

where
 $f$ = pressure between the plates,
 $V$ = voltage between the plates,
 $\epsilon_o$ = dielectric constant of free space,
 $\epsilon_r$ = relative dielectric constant,
 $s$ = distance between plates.

For example, if a MYLAR sheet of 0.0005 inch thickness is used, and a bias voltage of 750 volts is applied, the wafer hold-down pressure amounts to a theoretical 7 pounds per square inch, approximately. The presence of this theoretical pressure is difficult to verify experimentally, since it is almost impossible to apply a lifting force to an entire wafer surface without lifting one edge or applying a horizontal component of force. However, a satisfactorily high hold-down pressure has been obtained in practice. Since the pressure is fairly uniform, otherwise warped and bowed wafers can be held perfectly flat and in uniform focus over their entire surface by the electrostatic hold-down pressure.

In general, the bias voltage to be applied to the wafer 10 is given by the following formula, if a uniform potential gradient is to be maintained:

$$v_w = \frac{h}{d+h}(v_c - v_a) \quad (1)$$

where
- $v_w$ = potential (voltage) at the wafer 11,
- $v_c$ = potential at the photocathode 10,
- $v_a$ = potential at the anode or wafer support 18',
- $h$ = height of the wafer 11 above the wafer support 18', and
- $d$ = distance of the wafer 11 from the photocathode 10.

Another important consideration in the selection of the bias voltage is that the voltage difference between the photocathode mask 10 and the wafer 11 should be such that electrons emitted from the mask will be properly focused by the focusing coils 14 (FIG. 1). For proper focus of the projected electron image, this voltage difference is related to the distance $d$ between the mask 10 and wafer 11, and to the flux density of the focusing field, by the following formula:

$$d = \frac{10.59 \sqrt{v_c - v_w}}{B} \quad (2)$$

where
- B = flux density of focusing field (in gauss), and $d$ in centimeters.

It will be apparent from equation (2) that proper focus can be maintained only if the voltage difference $v_c - v_w$ is kept constant, assuming that the distance $d$ and flux density B are not adjusted. Consequently, it is advantagous to ground the wafer 11, thereby satisfying the focus equation (2) without having to vary any of the other quantities in the equation. Uniformity of potential gradient can then be obtained by varying the voltage source 32, and thereby the voltage $v_a$ applied to the wafer support 18'. The disadvantage of this configuration, i.e., grounding the wafer 11, is that the wafer support 18' must necessarily be maintained at several hundred volts above ground potential, and this may prove to be a practical inconvenience. Grounding the wafer support 18' avoids the latter problem, of course, but requires refocusing whenever the bias voltage source 32 is adjusted. Accordingly, the choice of whether to ground the wafer support 18' or the wafer 11 is largely a matter of convenience.

It will be appreciated that, since the wafer 11 in the configuration of FIG. 3, unlike that of FIG. 2, requires no conductive surfaces above it to hold it in place, the equipotential surface between the wafer and the mask 10 will be substantially flat and parallel planar surfaces, and little or no distortion of the electron-accelerating field will result from the wafer supporting means employed.

Another embodiment of the invention which also reduces distortion of the electron-accelerating field, but which does not utilize electrostatic forces for securing the wafer 11, is shown in FIGS. 4 and 5. In this alternative embodiment, the wafer 11 is held against a lip 21''. As best shown in FIG. 5, the lip 21'' has an outer ledge 40 against which the wafer 11 is secured, and an inner portion 41 projecting further inwardly above, but not in contact with the wafer 11. The upper surface of the wafer support 18'' and the entire surface of the inner portion 41 of the lip 21'' are covered or coated with a dielectric sheet 25''. Affixed to and covering the sheet 25'' is a conductive layer 42 which also extends over the upper surface of the wafer support 18'', including the upper and edge surfaces of the inner portion 41 of the lip 21'', and also extends for some distance beneath the undersurface of the inner portion of the lip. The conductive layer 42 is biased at a negative potential relative to the wafer support 18'' by a voltage source 43, and this has the effect of flattening the equipotential surfaces in the electron-accelerting field which would be otherwise distorted by the presence of the wafer holder 18'' and lip 21''. The voltage source 43 may be adjusted for minimum distortion of the electron-accelerating field.

It will be apparent from the foregoing that the present invention significantly advances the state-of-the-art of wafer hold-down devices for electron projection systems. In particular, the use of either of the described embodiments of the invention minimizes undesirable distortion of the electron-accelerting field, and use of the first-described embodiment also provides an electrostatically induced, uniform holding and flattening pressure over the entire wafer surface.

Although particular embodiments of the invention have been described in detail for purposes of illustration, it will be appreciated that various modifications may be made without departing from the spirit and scope of the invention. Accordingly, the invention is not to be limited, except as by the appended claims.

I claim:

1. For use in an electron image projection system having an electron-emitting cathode, apparatus for supporting a target wafer in an electron-accelerating electric field with minimal distortion of the field, said apparatus comprising:
    a wafer support;
    a dielectric layer overlying said support; and
    means for applying a bias voltage across the thickness of said dielectric layer, and for thereby maintaining substantially uniform and undistorted voltage gradient in the electric field between the cathode and said wafer support.

2. For use in an electron image projection system having an electron-emitting cathode, apparatus for supporting a target wafer in an electron-accelerating electric field with minimal distortion of the field, said apparatus comprising:
    wafer support means with a wafer-surrounding portion also serving as an anode for acceleration of the electrons, and a wafer-securing portion projecting into the electric field from said wafer-surrounding portion;
    means for applying a bias voltage across the thickness of said dielectric sheet, and for thereby maintaining a substantially uniform and undistorted voltage gradient in the electric field between the cathode and said wafer support means.

3. For use in an electron image projection system, apparatus for supporting a target wafer in an electron-accelerating electric field between a cathode and an anode without significant distortion of the field, said apparatus comprising:
    pedestal means affixed to the anode and having a flat surface against which the wafer is to be secured;

a relatively thin sheet of dielectric material covering said pedestal means and insulating the wafer from said pedestal means; and means for applying a bias voltage between the wafer and said pedestal means, and for thereby charging the wafer to such a potential as to maintain a relatively uniform and undistorted voltage gradient from the cathode to the anode, and electrostatically attracting and flattening the wafer to said pedestal surface.

4. Apparatus as set forth in claim 3, and further including dielectric sheet retaining means for securing said sheet in position over said pedestal means.

5. Apparatus as set forth in claim 3, wherein:
said pedestal means and said dielectric sheet have aligned openings therethrough; and
said means for applying a bias voltage includes wafer-contacting means located in said aligned openings to make electrical contact with the wafer, bias voltage source means, and means connecting said voltage source means with said pedestal means and said wafer-contacting means.

6. Apparatus as set forth in claim 5, wherein said wafer-contacting means includes:
a pointed contact pin; and
resilient means for urging said contact pin into good electrical contact with the wafer surface.

7. Apparatus as set forth in claim 5, wherein said bias voltage source means is adjustable to minimize distortion of the electric field.

8. Apparatus as set forth in claim 5, wherein:
said pedestal means is electrically grounded; and
said bias voltage source means is connected to bias the wafer at a negative potential relative to ground.

9. Apparatus as set forth in claim 5, wherein:
the wafer is electrically grounded through said wafer-contacting means; and
said bias voltage source means is connected to bias said pedestal means positively with respect to the grounded wafer.

10. For use in an electron image projection system having an electron-emitting cathode, apparatus for supporting a target wafer in an electron-accelerating electric field without significantly distorting the field, said apparatus comprising:
a wafer-supporting anode structure;
an anode pedestal having a flat surface elevated from said anode structure;
a relatively thin sheet of dielectric material covering said anode pedestal surface;
retaining means having an opening sized to fit snugly over said pedestal covered with said sheet, to retain said sheet in position;
electrical contact means including resilient means for obtaining reliable electrical contact with the wafer;
means for applying a bias voltage between said electrical contact means and said pedestal, to charge the wafer to such a potential as to maintain a substantially uniform and undistorted voltage gradient in the electron-accelerating field between the cathode and said anode pedestal, and to attract and flatten the wafer electrostatically to said pedestal surface.

11. For use in an electron projection system, apparatus for supporting a target wafer in an electron-accelerating electric field with minimal distortion to the field, said apparatus comprising:
wafer support means including a lip extending over the edges of the wafer, the wafer being secured by pressure urging it against said lip, said lip including an outer portion against which the wafer is held,
an inner portion extending significantly across but spaced from the wafer,
a dielectric sheet substantially covering said lip except for said outer portion, and
a conductive coating substantially covering said dielectric sheet; and
means for applying a bias voltage between said conductive coating and the wafer, whereby the bias voltage tends to maintain uniformity in the electron-accelerating field, which would otherwise be distorted by the presence of said lip.

12. A method of supporting a target wafer with minimal electric field distortion due to the presence of a target support in an electron-accelerating field between a cathode and an anode of an electron image projection system, said method comprising the steps of:
supporting a target wafer on the target support;
interposing in the electric field an insulating layer positioned on the target support; and
applying a bias voltage across the thickness of the insulating layer, thereby to maintain substantial uniformity of the electric field between the cathode and anode.

13. A method as set forth in claim 12, and further including the step of varying the bias voltage to minimize distortion of the electric field.

14. A method as set forth in claim 13, wherein:
said step of interposing the insulating layer positions the layer between the target support and the target wafer; and
said step of supporting the target wafer includes electrostatically attracting and flattening the target wafer against the target support as a result of said step of applying the bias voltage.

* * * * *

UNITED STATES PATENT AND TRADEMARK OFFICE
CERTIFICATE OF CORRECTION

PATENT NO. : 3,983,401
DATED : September 28, 1976
INVENTOR(S) : William R. Livesay It is certified that error appears in the above-identified patent and that said Letters Patent are hereby corrected as shown below:

Column 7, line 26, equation (2) should read $$--d = \frac{10.59\sqrt{V_C - V_W}}{B} --;$$

line 55, "surface" should be --surfaces--.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks